United States Patent
Kim et al.

(10) Patent No.: US 9,135,975 B2
(45) Date of Patent: Sep. 15, 2015

(54) WRITE PULSE WIDTH SCHEME IN A RESISTIVE MEMORY

(71) Applicant: QUALCOMM Incorporated, San Diego, CA (US)

(72) Inventors: Taehyun Kim, San Diego, CA (US); Jung Pill Kim, San Diego, CA (US); Sungryul Kim, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/064,959

(22) Filed: Oct. 28, 2013

(65) Prior Publication Data

US 2015/0117086 A1    Apr. 30, 2015

(51) Int. Cl.

| | |
|---|---|
| *G11C 11/16* | (2006.01) |
| *G11C 29/54* | (2006.01) |
| *G11C 13/00* | (2006.01) |
| *G11C 29/02* | (2006.01) |
| *G11C 29/24* | (2006.01) |

(52) U.S. Cl.
CPC ........ *G11C 11/1675* (2013.01); *G11C 11/1677* (2013.01); *G11C 13/0002* (2013.01); *G11C 13/0069* (2013.01); *G11C 29/021* (2013.01); *G11C 29/023* (2013.01); *G11C 29/028* (2013.01); *G11C 29/24* (2013.01); *G11C 2013/0083* (2013.01); *G11C 2013/0092* (2013.01)

(58) Field of Classification Search
None
See application file for complete search history.

(56) References Cited

U.S. PATENT DOCUMENTS

| | | | |
|---|---|---|---|
| 6,625,057 B2 | 9/2003 | Iwata | |
| 7,573,758 B2 | 8/2009 | Park et al. | |
| 7,876,606 B2 | 1/2011 | Philipp et al. | |
| 8,164,966 B2 | 4/2012 | Stratz et al. | |
| 8,477,542 B2 | 7/2013 | Nagashima et al. | |
| 8,488,363 B2 | 7/2013 | Rao et al. | |
| 2005/0226034 A1* | 10/2005 | Pemer | 365/158 |
| 2011/0110172 A1* | 5/2011 | Lee et al. | 365/189.16 |
| 2011/0273926 A1 | 11/2011 | Wu et al. | |
| 2012/0182815 A1 | 7/2012 | Jeon et al. | |

FOREIGN PATENT DOCUMENTS

WO    2013112336 A2    8/2013

OTHER PUBLICATIONS

International Search Report and Written Opinion—PCT/US2014/060639—ISA/EPO—Jan. 27, 2015.

* cited by examiner

*Primary Examiner* — James G Norman
(74) *Attorney, Agent, or Firm* — Seyfarth Shaw LLP

(57) ABSTRACT

A resistive memory array includes a controller, a test reset driver coupled to the controller, a test write driver also coupled to the controller, and a test read sense amplifier also coupled to the controller. The resistive memory array also includes a set of test resistive memory elements representing a resistive memory macro. The test resistive memory elements are coupled to the test reset driver, the test write driver and the test read sense amplifier. A change in the state of one of the test resistive memory elements represents a change in the state of a set of corresponding elements in the resistive memory macro.

18 Claims, 13 Drawing Sheets

WRITE PULSE WIDTH SCHEME IN A RESISTIVE MEMORY

TECHNICAL FIELD

The present disclosure generally relates to resistive memories such as magnetic random access memory (MRAM) devices or resistive random access memory (RRAM) devices. More specifically, one aspect of the present disclosure relates to a write pulse width scheme in a resistive memory.

BACKGROUND

Unlike conventional random access memory (RAM) chip technologies, in magnetic RAM (MRAM) data is stored by magnetic polarization of storage elements. The storage elements are formed from two ferromagnetic layers separated by a tunneling layer. One of the two ferromagnetic layers, which is referred to as the fixed (e.g., pinned) layer, has a magnetization that is fixed in a particular direction. The other ferromagnetic magnetic layer, which is referred to as the free layer, has a magnetization direction that can be altered to two different states. One such device having a fixed layer, a tunneling layer, and a free layer is a magnetic tunnel junction (MTJ).

In an MTJ, the different states of the free layer may be used to represent either a logic "1" or a logic "0". In particular, the electrical resistance of an MTJ depends on whether the free layer magnetization and fixed layer magnetization are parallel or anti-parallel with each other. For example, a logic "1" state is represented when the free layer magnetization is anti-parallel to the fixed layer magnetization. A logic "0" state is represented when the free layer magnetization is parallel to the fixed layer magnetization. A memory device such as MRAM is built from an array of individually addressable MTJs.

To write data in a conventional MRAM, a write current exceeding a critical switching current is applied through an MTJ. The write current should exceed the switching current by a sufficient amount to change the magnetization direction of the free layer. When the write current flows in a first direction, the MTJ is placed into or remains in a first state. In the first state, a free layer magnetization direction and a fixed layer magnetization direction of the MTJ are aligned in a parallel orientation. When the write current flows in a second direction, opposite to the first direction, the MTJ is placed into or remains in a second state. In the second state, the free layer magnetization and fixed layer magnetization of the MTJ are in an anti-parallel orientation.

SUMMARY

In one aspect, a resistive memory array is disclosed. The resistive memory array includes a controller, a test reset driver coupled to the controller, a test write driver coupled to the controller, a test read sense amplifier coupled to the controller, and a set of test resistive memory elements representing a resistive memory macro. The set of test resistive memory elements are coupled to the test reset driver, the test write driver and the test read sense amplifier. A change in the state of at least one of the set of test resistive memory elements represents a change in the state of a set of corresponding elements in the resistive memory macro.

Another aspect discloses a resistive memory array including means for controlling the resistive memory array, means for resetting a set of test resistive memory elements coupled to the means for controlling, means for writing to the set of test resistive memory elements coupled to the means for controlling, and means for reading from the set of test resistive memory elements coupled to the means for controlling. The set of test resistive memory elements represents a resistive memory macro. The set of test resistive memory elements are also coupled to the means for resetting, the means for writing and means for reading. A change in the state of at least one of the set of test resistive memory elements represents a change in the state of a set of corresponding elements in the resistive memory macro.

In another aspect, a method includes setting a set of test resistive memory elements to a first state. The method also includes writing to the set of test resistive memory elements with a test pulse including a write driver strength and a pulse width to switch the set of test resistive memory elements from the first state to a second state. The method further includes determining a switching rate percentage corresponding to a number of test resistive memory elements switched from the first state to the second state out of the set of test resistive memory elements. The method also includes determining if the switching rate percentage is equal to the target switching rate percentage. The method further includes modifying the test pulse when the switching rate percentage is not equal to the target switching rate percentage. The method also includes storing the write driver strength and the pulse width of the test pulse when the switching rate percentage equals the target switching rate percentage. The method further includes writing to a set of main resistive memory elements with a main pulse having an actual write driver strength and an actual pulse width corresponding to the write driver strength and the pulse width of the test pulse.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
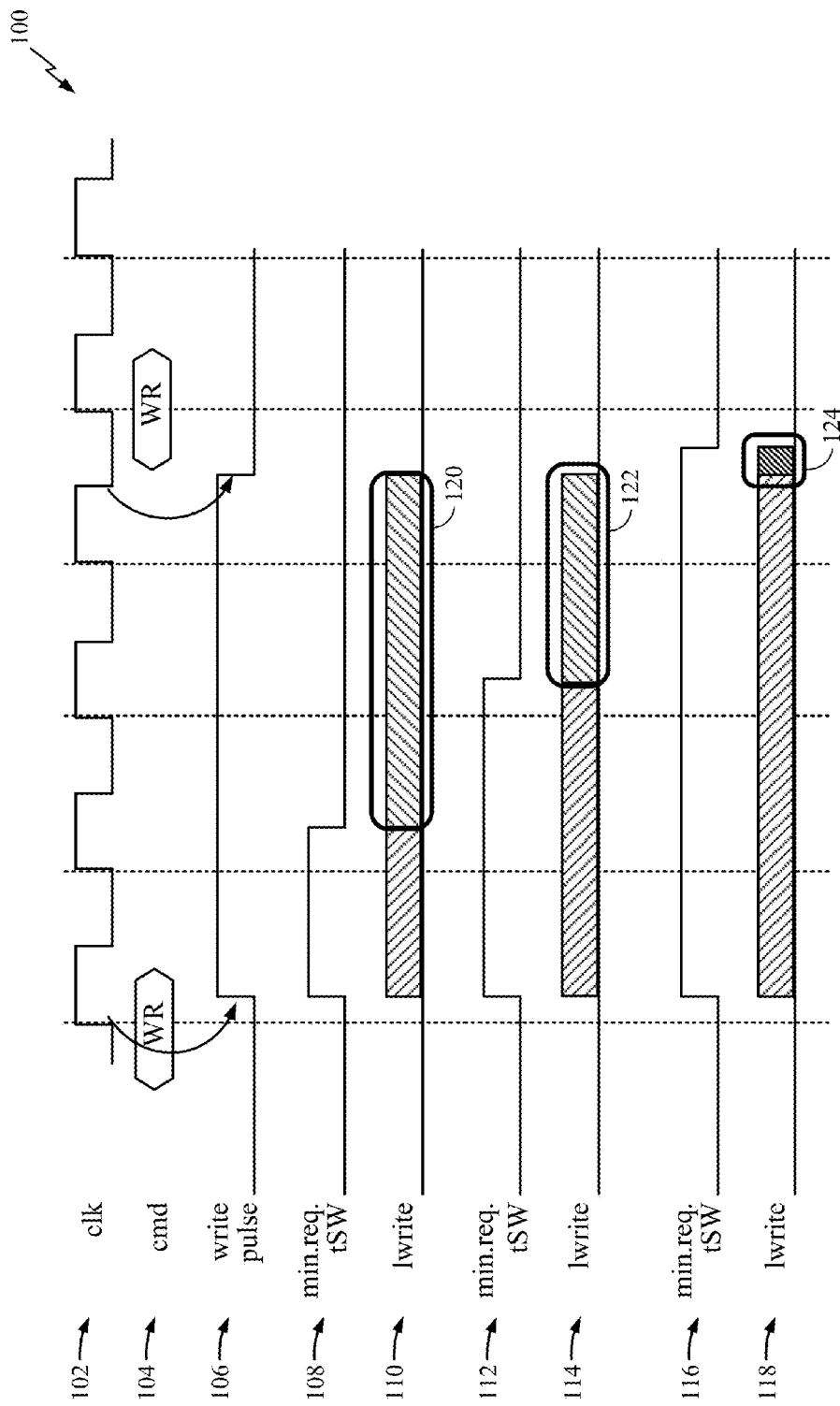
FIG. 1 is a timing diagram illustrating write pulse widths of a resistive memory device of the related art.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form to avoid obscuring such concepts. As described herein, the use of the term "and/or" is intended to represent an "inclusive OR", and the use of the term "or" is intended to represent an "exclusive OR".

A resistive memory device may include a magnetic random access memory (MRAM), a resistive random access memory (RRAM), or any resistive memory with a reference system. In a resistive memory device (e.g., MRAM), data is stored by magnetic polarization of storage elements. The storage elements are formed from two ferromagnetic layers separated by a tunneling layer. One of the two ferromagnetic layers, which is referred to as the fixed (e.g., pinned) layer, has a magnetization that is fixed in a particular direction. The other ferromagnetic magnetic layer, which is referred to as the free layer, has a magnetization direction that can be altered to two different states. One such device having a fixed layer, a tunneling layer, and a free layer is a magnetic tunnel junction (MTJ).

To read data in a resistive memory device, a read current may flow through the MTJ via the same current path used to write data in the MTJ. If the magnetizations of the MTJ's free layer and fixed layer are oriented parallel to each other, the MTJ presents a resistance that is different than the resistance the MTJ would present if the magnetizations of the free layer and the fixed layer were in an anti-parallel orientation. In a resistive memory device, two distinct states are defined by two different resistances of an MTJ in a bitcell of the MRAM. The two different resistances represent a logic 0 and a logic 1 value stored by the MTJ.

To determine whether data in a resistive memory device represents a logic 1 or a logic 0, the resistance of the MTJ in the bitcell is compared with a reference resistance. The reference resistance in conventional MRAM circuitry is a mid-point resistance between the resistance of an MTJ having a parallel magnetic orientation and an MTJ having an anti-parallel magnetic orientation. One way of generating a mid-point reference resistance is coupling an MTJ known to have a parallel magnetic orientation and an MTJ known to have an anti-parallel magnetic orientation in parallel with each other.

The internal write pulse width of a resistive memory device is the width of a cycle in a write signal. An internal write pulse width that is not sized correctly may lead to problems, such as high write power consumption or premature device failure. For example, Magnesium Oxide (MgO) is a common material used for tunnel barriers in magnetic tunnel junctions (MTJs) of a resistive memory device. Unfortunately, if the device frequently switches to a "writing" state, then the MgO tunnel barriers may break down under the high stress levels. The MgO breakdown mechanism may be the same as the time dependent dielectric breakdown (TDDB) in CMOS technologies. Therefore, stressing the MgO material for a long period of time under operating voltage conditions may result in breakdown of the MgO barrier. These MgO reliability concerns arise because as a material, MgO is very thin and the writing pulse width is longer than a specified writing pulse width.

In addition, the internal write pulse width of a resistive memory device should be longer than the pulse width of the signal that switches the MTJs from an "on" state to an "off" state. The signal pulse width that switches the MTJ between states is referred to as the MTJ switching pulse width. The longer internal write pulse width increases the switching rate of the MTJ array, where most or all the MTJs are successfully switched from one state to another.

The internal write pulse width may not match or track the actual MTJ switching pulse width for a given MTJ array due to different process variations. For example, a logic process variation is a variation of the magnetic field that generates a logic state across the array. Similarly, an MTJ process variation is a variation of the minimum switching time to switch from one state to the other across an array. The logic process variation is independent of the MTJ process variation. The internal write pulse width of a resistive memory device can also be determined without looking at the MTJ switching pulse width. For example, the internal write pulse width can be determined by either the input clock period from an internally generated clock or an internal ring oscillator period.

In one aspect of the disclosure, the energy expended by an internal write pulse within a resistive memory device is improved by adjusting the width of the internal write pulse based on a measured MTJ switching pulse width for a representative sample of the MTJs in the array. The energy expended by the internal write pulse may be improved by adjusting a write driver strength used to write to a representative sample of the MTJs in the array. As a result, the internal write pulse more closely matches the MTJ switching pulse of a given array. By closely matching these pulses in terms of width and/or strength, this aspect of the present disclosure reduces MTJ breakdown and lessens stress on MTJ materials (e.g., MgO). In addition, the write power consumption of the resistive memory device is reduced. The MTJ array is made more efficient because there is less power consumption overall in devices employing one or more aspects of the present disclosure.

In another aspect of the disclosure, the internal write width pulse is dynamically adjusted according to an iterative process to find a write width pulse value that produces effective results in the test array of MTJs. In another aspect of the disclosure, the write driver strength is dynamically adjusted according to an iterative process to find a write driver strength value that produces effective results in the test array of the MTJs. These results may then be used as write pulses for the memory elements in the MTJ array. The write width pulse may also be used in tandem with the write driver strength to ensure that all the resistive memory elements (such as MTJs) of resistive memory device switch efficiently and consistently.

FIG. 1 is a timing diagram 100 illustrating write pulse widths of a resistive memory device of the related art. A clock signal 102 triggers a write operation (WR) 104, in which a write pulse signal 106 is active (e.g., goes high) for a period of time. The period of time in which the write pulse signal 106 is active can represent a resistive memory device switching from a first state (e.g., parallel in the case of a MTJ or MRAM) to a second state (e.g., anti-parallel in the case of a MTJ or MRAM). FIG. 1 illustrates three different scenarios (e.g., process variations) that affect a write pulse width.

In the first scenario, a fast corner variation occurs in both the MTJ process (for switching) and the logic process (for logical elements to write). In this first scenario, a fast corner process variation causes the first switching pulse width 108 to de-asset prior to de-assertion of the first internal write pulse width 110. That is, the fast corner process variation causes the first internal write pulse width 110 to substantially exceed the first switching pulse width 108. This mismatch between the internal write pulse width and, for example, the measured memory (e.g., MTJ) array switch pulse width expends the wasted energy shown by the first mismatch segment 120.

In the second scenario, a normal corner occurs in both the MTJ process and the logic process. In this second scenario, although a normal corner occurs in both the MTJ process and logic process, the second switching pulse width 112 is de-asserted prior to de-assertion of the second internal write pulse width 114. That is, the normal corner in both the MTJ process and the logic process increases the second switching pulse width 112. The second switching pulse width 112, however, is still less than the second internal write pulse width 114. This mismatch between the pulse widths results in the wasted energy shown by the second mismatch segment 122.

In the third scenario, a slow corner variation occurs in both the MTJ process and the logic process. In this third scenario, the slow corner process variation causes the third switching pulse width 116 to de-assert (following de-assertion of the third internal write pulse width 118, as triggered by de-assertion of the write pulse signal 106. That is, the slow corner process variation substantially increases the third switching pulse width 116. This mismatch between the third internal write pulse width 118 and the third switching pulse width 116 provides an insufficient switching time for all the resistive memory elements (e.g., MTJs) to switch from one state to another. This in turn leads to a switching fail period 124 in which a certain percentage of the resistive memory elements are switched.

In view of these scenarios, energy loss is reduced when the switching pulse width of the resistive memory matches the internal write pulse width. Although the internal write pulse widths (e.g., signals 110, 114 and 118) may be determined by an external clock period (e.g., clock signal 102), improved results may be achieved if the internal write pulse width more closely tracks the switching pulse width of a resistive memory.

Figure 2:
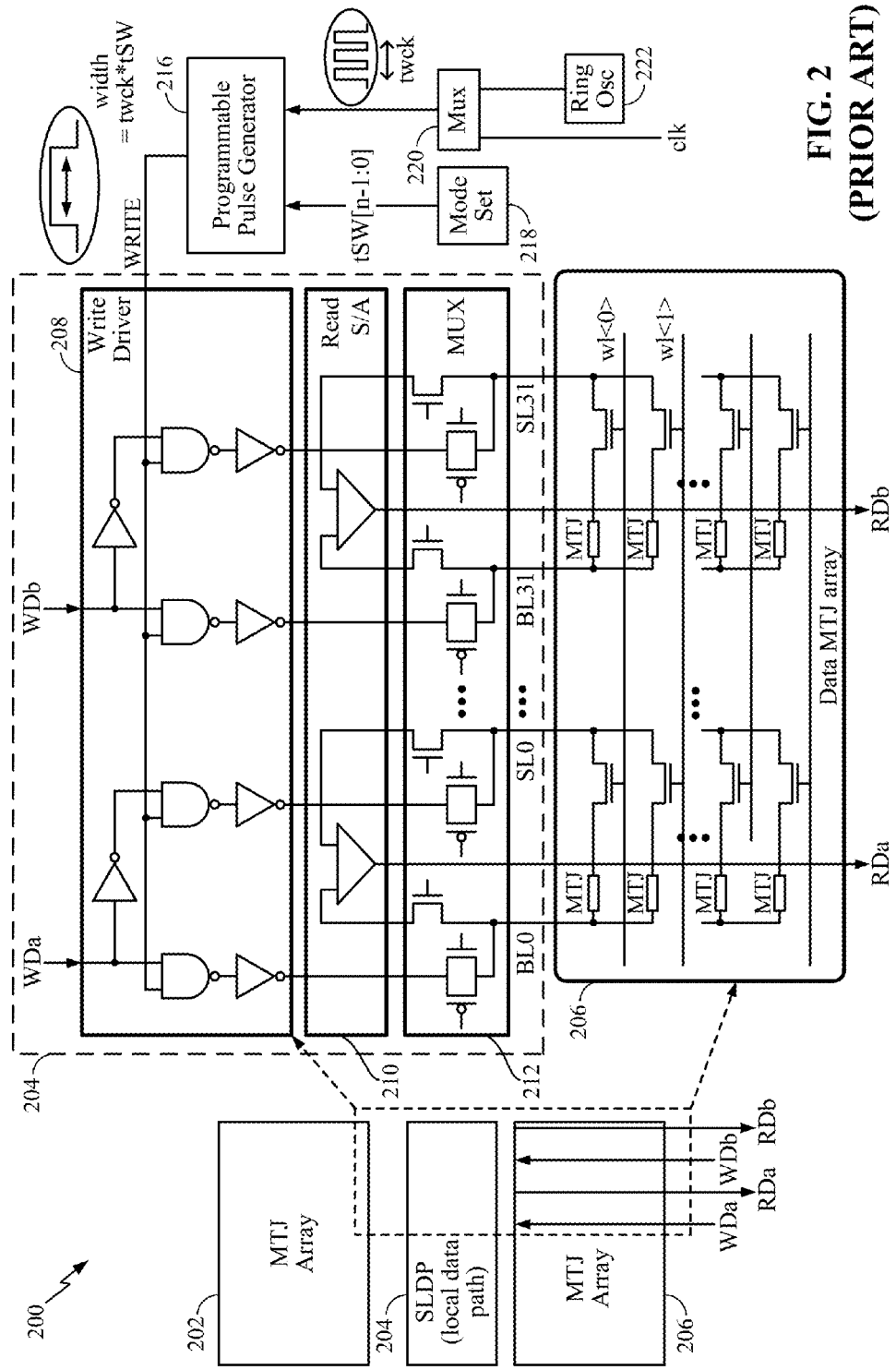
FIG. 2 is a schematic diagram of a resistive memory device of the related art.

FIG. 2 is a schematic diagram of a resistive memory device 200. The resistive memory device 200 includes a first resistive memory element array 202 storing a set of resistive memory elements such as MTJs. The resistive memory device 200 also includes a second resistive memory element array 206 and a local data path 204, with logic coupling to the first resistive memory element array 202 and the second resistive memory element array 206. The local data path 204 includes a write driver 208, a read sense amplifier 210 and a first multiplexer 212. The write data signals WDa and WDb are input into the write driver 208. Both of the write data signals WDa and WDb carry data being written to the second resistive memory element array 206. The read data signals RDa and RDb are output from the read sense amplifier 210. Both of the read data signals carry data being read from the second resistive memory element array 206. The write data signals WDa and WDb are processed through the first multiplexer 212. In this configuration, the write data signals WDa and WDb propagate over the bit lines (e.g., BL0 ... BL31) and the source lines (e.g., SL0 ... SL31) to write data within the resistive memory elements of the second resistive memory element array 206.

The WRITE signal generated from a programmable pulse generator 216 is a signal that has a write pulse width. In one configuration, the write pulse width may be the product of the write clock pulse width (twck) multiplied by the switching pulse width (tSW). The programmable pulse generator 216 also includes an input for a switching pulse width signal tSW[n−1:0] from a mode set block 218 and an input for a write clock signal twck from a second multiplexer 220. A clock signal clk and a signal from a ring oscillator 222 are inputs of the second multiplexer 220 to generate the write clock signal twck.

Figure 3:
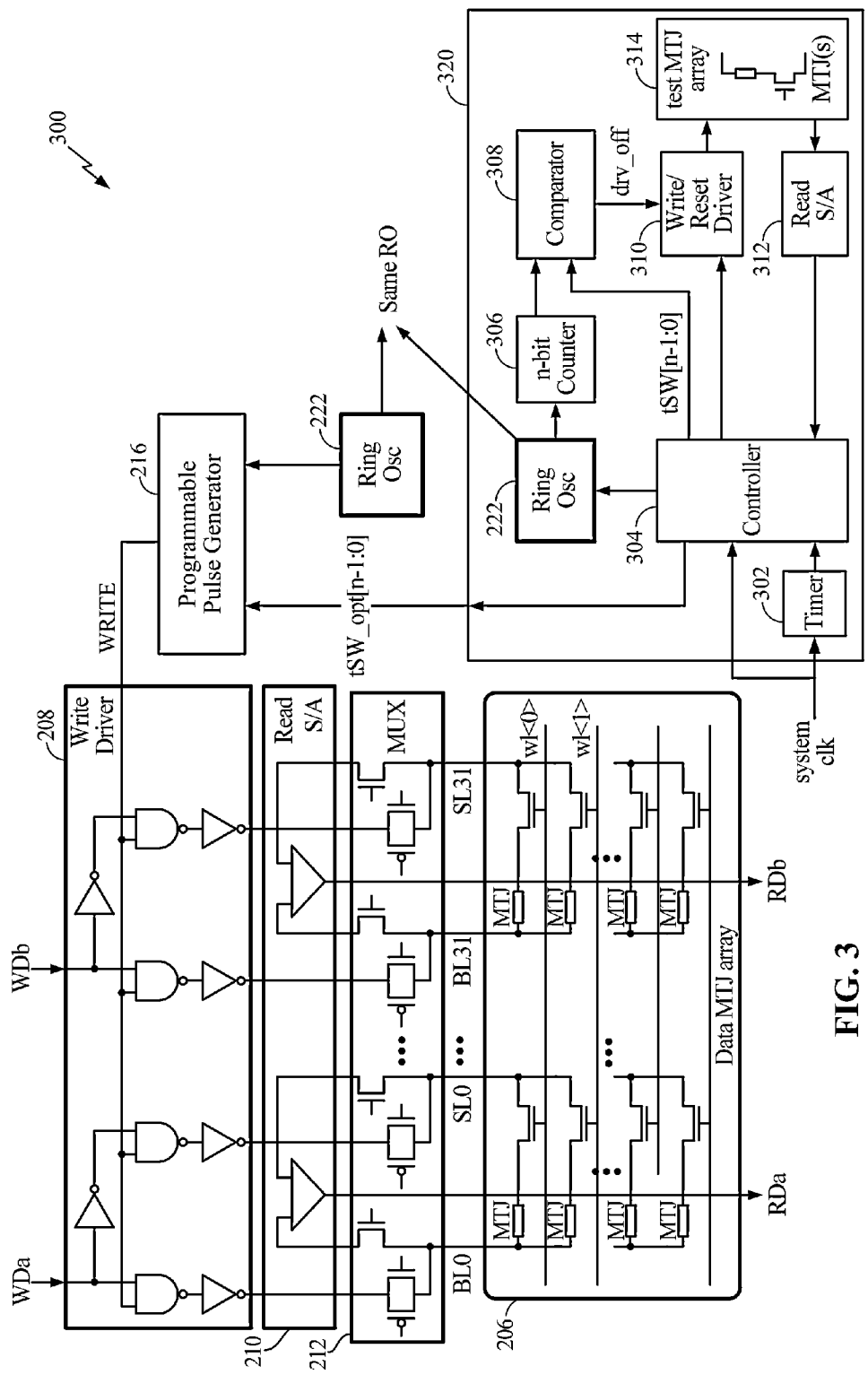
FIG. 3 is a schematic diagram of a resistive memory device designed to adjust write pulse width according to an aspect of the present disclosure.

FIG. 3 is a schematic diagram of a resistive memory device 300 designed to adjust write pulse width according to an aspect of the present disclosure. The resistive memory device 300 is similar to the resistive memory device 200 of FIG. 2 as far as the write driver 208, the read sense amplifier 210, the first multiplexer 212, the second resistive memory element array 206, and the programmable pulse generator 216. Two different input signals, however, are provided to the programmable pulse generator 216 of the resistive memory device 300 compared to the two input signals that are provided to the resistive memory device 200: a signal from a ring oscillator 222 and an adjustable write pulse width signal (tSW_opt[n−1:0]) from an adjustable write pulse width signal generator 320. The adjustable write pulse width signal generator 320 includes an input for a system clock (system clk) signal and processes it with a timer 302, a controller 304, the ring oscillator 222 (the same ring oscillator 222 that inputs a signal to the programmable pulse generator 216), an n-bit counter 306, a comparator 308, a write/reset driver 310 and an internal read sense amplifier 312. Although the same ring oscillator is used in the example of FIG. 3, a different ring oscillator could be added. In addition, a test resistive memory element array 314 includes resistive memory elements such as MTJs. The adjustable write pulse width signal generator 320 is further illustrated in FIG. 4.

Figure 4:
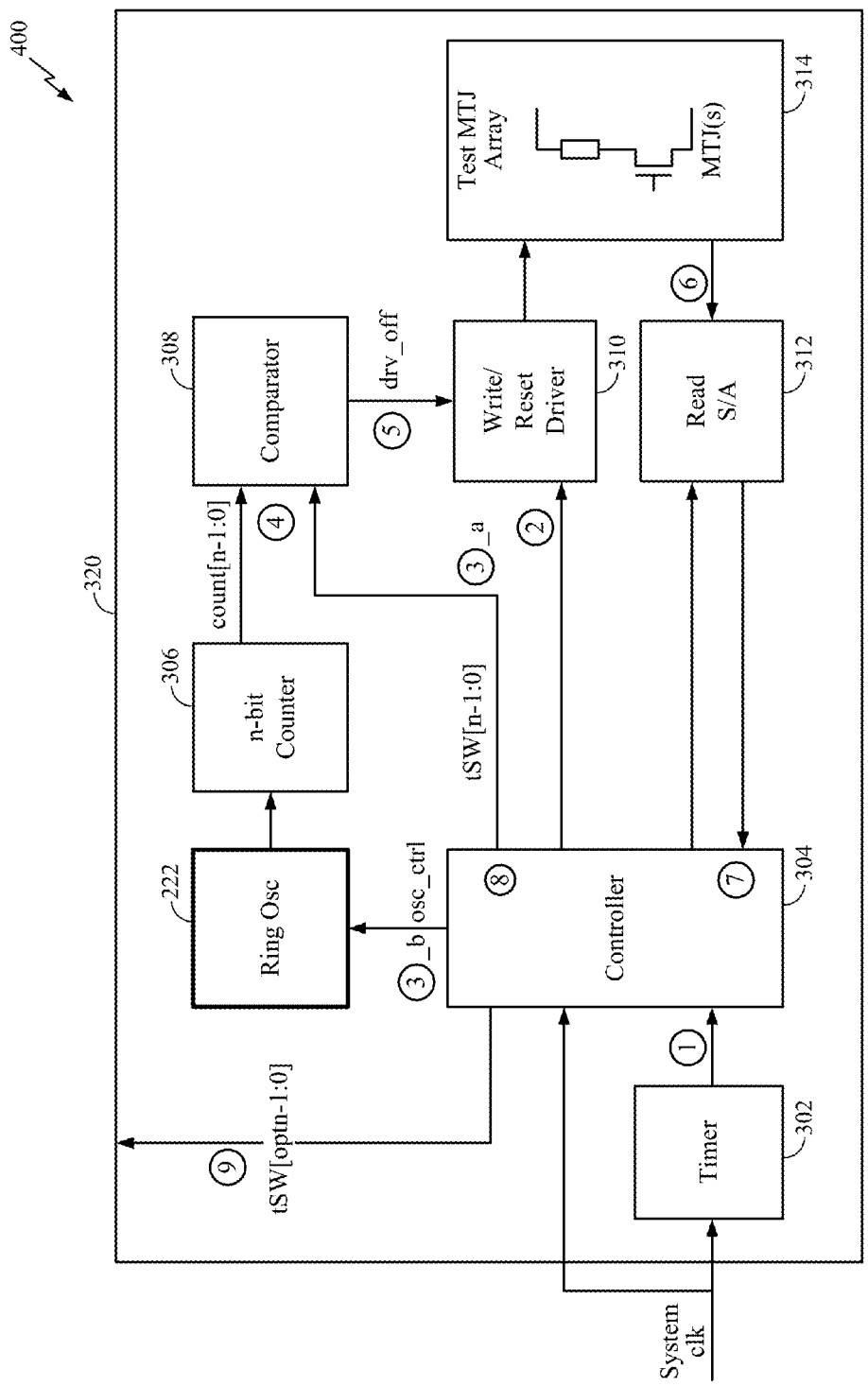
FIG. 4 is a schematic diagram of an adjusted pulse width signal generator according to an aspect of the present disclosure.

FIG. 4 is a schematic diagram 400 of an adjustable write pulse width signal generator 320 according to an aspect of the present disclosure. The operation of the adjustable write pulse width signal generator 320 is described in chronological order. Initially, the system clock (system clk) signal is provided to the adjustable write pulse width signal generator 320.

First (shown as "(1)" in FIG. 4), the timer 302 triggers the periodic write pulse width monitoring process. The timer 302 is initialized to zero before beginning the write pulse width monitoring process. Second (2), a signal is sent from the controller 304 to the write/reset driver 310 to turn on a reset driver and switch all the test resistive memory elements in the test resistive memory element array 314 to their first states. In the case of MTJs, the first state is either resistance parallel (Rp) or resistance anti-parallel (Rap). Third (3_a), a write driver component of the write/reset driver 310 is turned on to switch all the test resistive memory elements to their second state from the first state. Also as part of the third step (3_b), an oscillator control signal (osc_ctrl) is sent from the controller 304 to the ring oscillator 222 to turn on or enable the ring oscillator output signal.

In this configuration, the output of the ring oscillator 222 drives the n-bit counter 306, which in turn outputs a counter signal (cout[n−1:0]). Fourth (4), the output of the n-bit counter 306 (cout[n−1:0]) and the pulse width setting value (tSW[n−1:0]) from the controller 304 are compared by the comparator 308 to see if they are equal. Fifth (5), if cout[n−1:0] is equal to tSW[n−1:0], then a driver off signal (drv_off) is sent from the comparator 308 to the write/reset driver 310 to turn off the write driver component of the write/reset driver 310.

The process continues at sixth step (6) in which the states of the test resistive memory elements in the test resistive memory element array are read out and that read data is sent to the internal read sense amplifier 312. The switching rate is then calculated, which is a percentage expressing the number of resistive memory elements successfully switched out of the total number of resistive memory elements. Seventh (7), the switching rate is then compared to a target switching rate (which may be set or predefined by a user as 80%, 90%, 99%, 100%, etc.) in the controller 304. Eighth (8), if the switching rate is less than the target switching rate, then the pulse width setting value (tSW[n−1:0]) is incremented. If the switching rate is greater than the target switching rate, then the pulse width setting value (tSW[n−1:0]) is decremented. Incremented or decremented may mean increased or decreased by any value. Steps 2-8 are then repeated until the switching rate is equal to the target switching rate. Ninth (9) and finally, the macro write pulse cycle number of the resistive memory device, or the adjustable write pulse width signal (tSW_opt[n−1:0]) is set to be the pulse width setting value (tSW[n−1:0]) obtained in previous steps.

Figure 5:
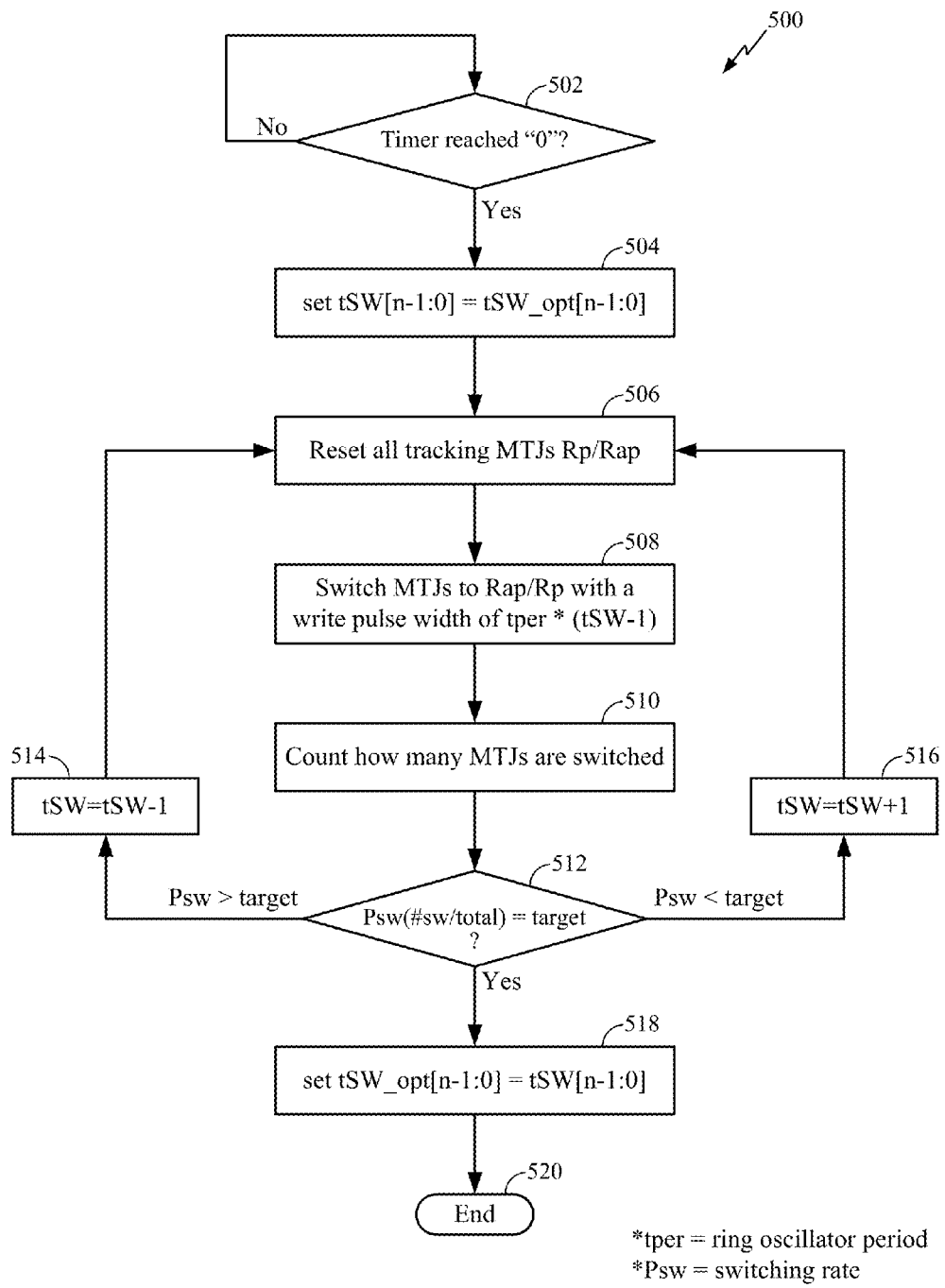
FIG. 5 is a process flow diagram illustrating a method of using a resistive memory device to adjust write pulse width according to an aspect of the present disclosure.

FIG. 5 is a process flow diagram 500 illustrating a method of using a resistive memory device to adjust write pulse width according to an aspect of the present disclosure. The process flow diagram 500 is similar to the procedure flow discussed above in the schematic diagram 400 of FIG. 4. In decision block 502, the timer is compared to a "zero" (0) value and the initialization of the timer is determined. If the timer was not initialized, the timer is initialized and the process flow returns to the decision block 502. If the timer was initialized, then the process continues to block 504, where the pulse width setting value (tSW[n−1:0]) is set to the adjustable write pulse width signal value (tSW_opt[n−1:0]), which may initially be zero or have no values. In block 506, the resistive memory elements in a test resistive memory element array (e.g., test resistive memory element array 314) are reset to a first state. In block 508, the resistive memory elements in the test resistive memory element array are switched to a second state that is not the first state. The resistive memory elements are also switched with a write pulse width of the ring oscillator period (tper) multiplied by the pulse width setting value (tSW[i], where i is the relevant value in the tSW array).

In block 510, a count of the switched resistive memory elements is determined. In decision block 512, the switching rate (the percentage of successfully switched resistive memory elements in the test resistive memory element array 314 to the total number of resistive memory elements in the test resistive memory element array 314) is compared to a target switching rate, which may be set by a user to a value up to 100%. If the switching rate is greater than the target switching rate, then the pulse width setting value is decremented in block 514. If the switching rate is less than the target switching rate, then the pulse width setting value is incremented in block 516. If the switching rate is equal to the target switching rate, then the adjustable write pulse width value (tSW_opt[n−1:0]) is set to be the pulse width setting value (tSW[n−1:0]). In block 520, the method of the process flow diagram 500 terminates.

Figure 6:
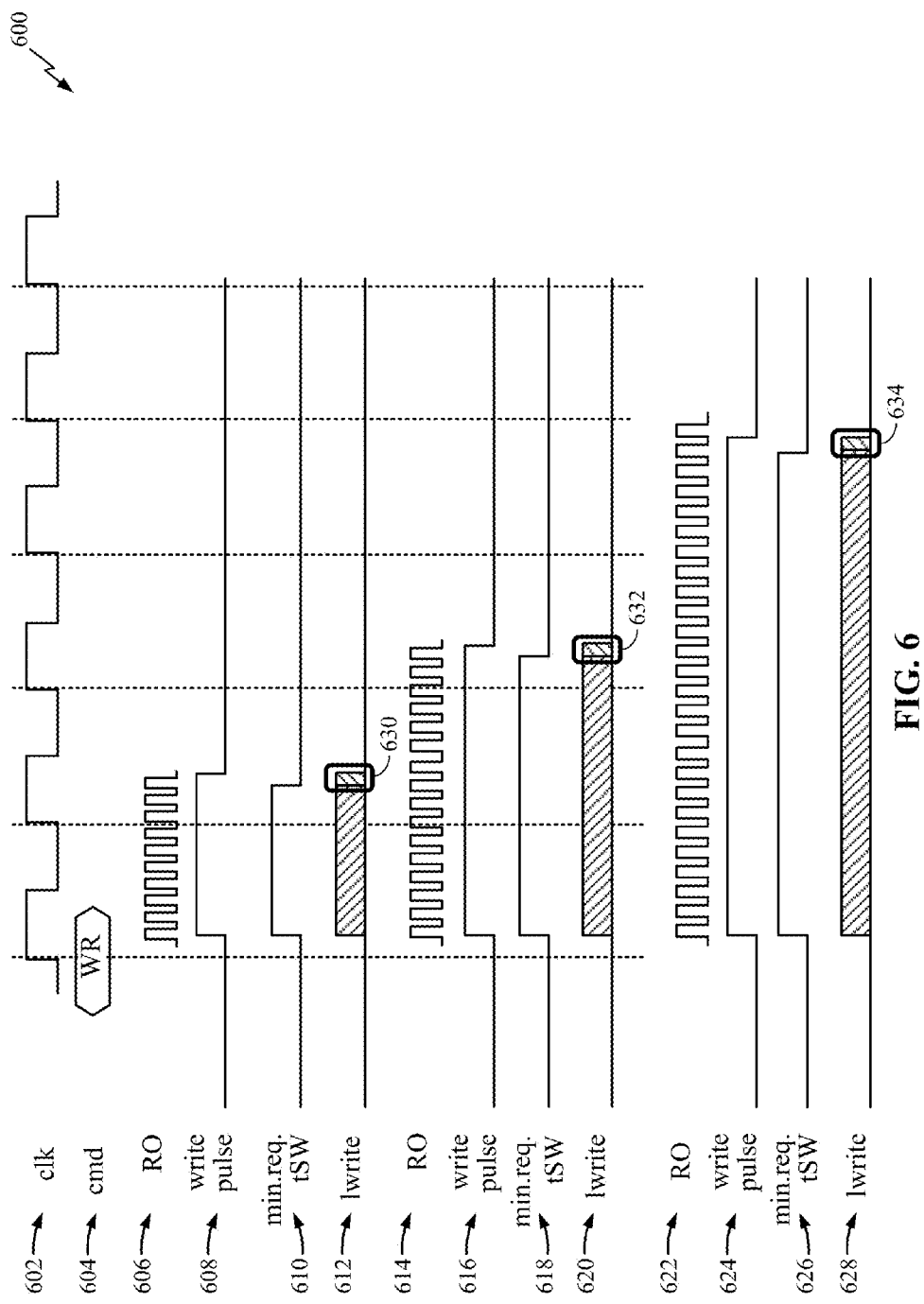
FIG. 6 is a timing diagram illustrating write pulse widths of a resistive memory device designed to adjust write pulse width according to an aspect of the present disclosure.

FIG. 6 is a timing diagram 600 illustrating write pulse widths of a resistive memory device with an adjusted, internal write pulse width according to an aspect of the present disclosure. The timing diagram 600 illustrates operation of the resistive memory device according to an adjusted, internal write pulse width. The resistive memory device may be the resistive memory device 300 in FIG. 3, the adjustable write pulse width signal generator 320 of FIG. 4, or a resistive memory device that operates according to the process flow diagram 500 of FIG. 5.

Referring again to FIG. 6, a clock signal 602 triggers a write operation (WR) 604, in which a write pulse 608 is asserted (e.g., goes high) for a period of time. The period of time in which the write pulse 608 is asserted can represent a resistive memory device switching from a first state (e.g., parallel in the case of a MTJ or MRAM) to a second state (e.g., anti-parallel in the case of a MTJ or MRAM). FIG. 6 also illustrates three different scenarios (e.g., process variations) that affect a write pulse width.

In the first scenario, a fast corner variation occurs in both the MTJ process (for switching) and the logic process (for logical elements to write). In this first scenario, a first ring oscillator signal 606, a first write pulse 608 and a first internal write pulse width 612 are adjusted to accommodate the fast corner process variation. Although a fast corner occurs in both the MTJ process and the logic process, the first switching pulse width 610 and the first internal write pulse width 612 are more closely matched. As a result, any mismatch between the first switching pulse width 610 and the first internal write pulse width 612 is reduced, as shown by the first mismatch segment 630.

In the second scenario, a normal corner occurs in both the MTJ process and the logic process. In this second scenario, a second ring oscillator signal 614, a second write pulse 616 and a second internal write pulse width 620 are adjusted according to a normal corner in both the MTJ process and logic process (e.g., an average process result or variation). As a result, the second switching pulse width 618 and the second internal write pulse width 620 are also more closely matched. As a result, any mismatch between the second switching pulse width 618 and the second internal write pulse width 620 is reduced, as shown by the second mismatch segment 632.

In the third scenario, a slow corner variation occurs in both the MTJ process and the logic process. In this third scenario, a third ring oscillator signal 622, a third write pulse 624 and a third internal write pulse width 628 are adjusted to accommodate the slow corner process variation. Although a slow corner occurs in both the MTJ process and the logic process, the third switching pulse width 626 and the third internal write pulse width 628 are more closely matched. As a result, any mismatch between the third switching pulse width 626 and the third internal write pulse width 628 is reduced, as shown by the third mismatch segment 634. This adjustment avoids a switching fail period 124 (FIG. 1) in which only a certain percentage of the resistive memory elements are switched.

As shown in FIG. 6, similar patterns are observed whether a fast corner, a normal corner or a slow corner occurs in both the MTJ process and the logic process. This adjustment pattern reduces the wasted energy shown in FIG. 1. In this aspect of the present disclosure, the improved energy efficiency is shown by comparing the mismatch segments of FIG. 6 (e.g., 630, 632, 634) to the mismatch segments (e.g., 120, 122) of FIG. 1. This improved energy efficiency results because the switching pulse width and the internal write pulse width more closely match one another. Furthermore, the switching pulse width does not end prematurely before the internal write pulse width. As a result, adjusting the internal write pulse width avoids the switching fail period 124 of FIG. 1 in which some portion of the resistive memory elements are not switched ("switching rate"). Therefore, adjusting a write pulse width may reduce power consumption and ensure that all the resistive memory elements are successfully switched, or at least ensures a high switching rate close to 100%.

Figure 7:
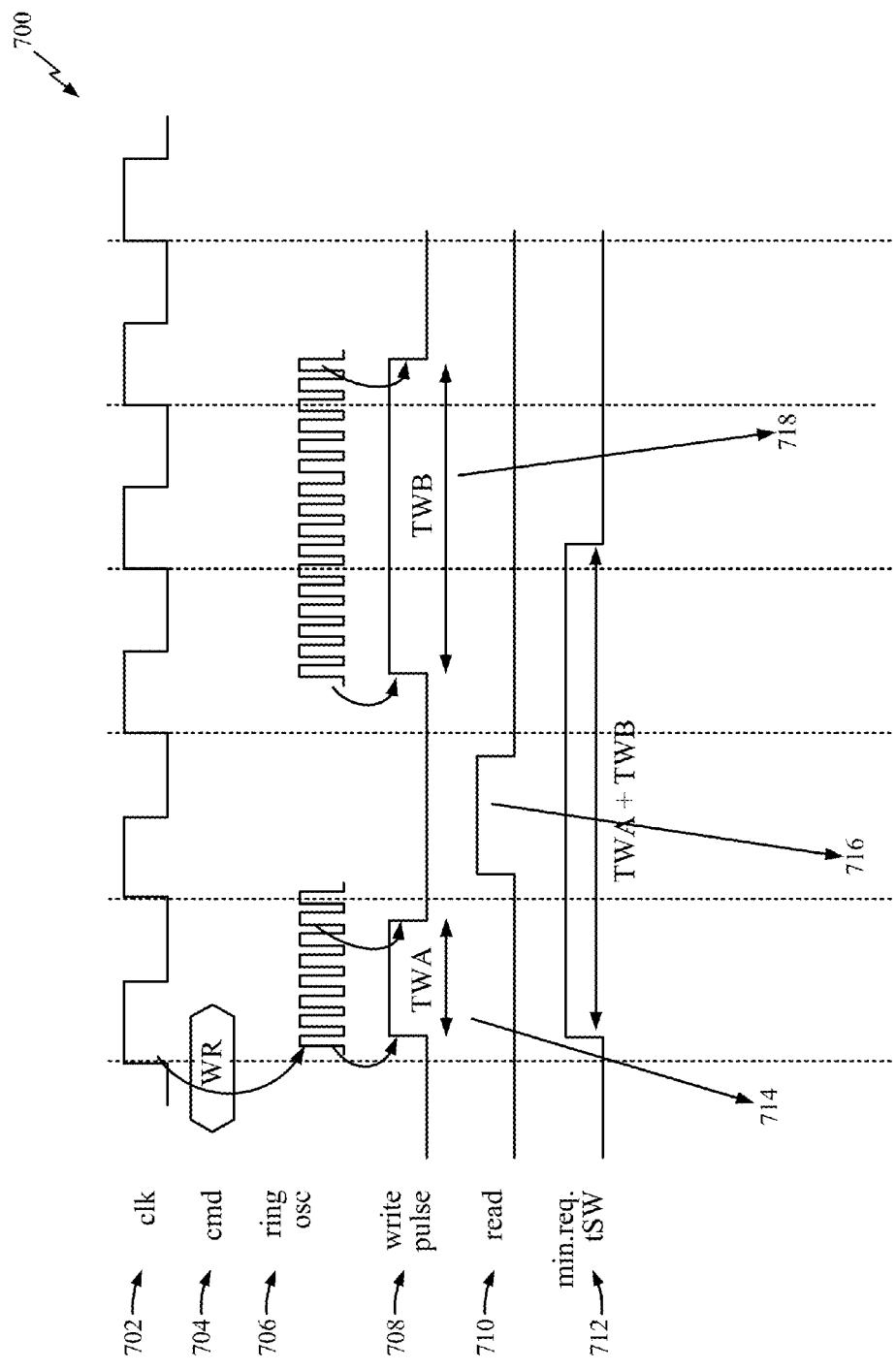
FIG. 7 is another timing diagram for a resistive memory device designed to adjust write pulse width according to an aspect of the present disclosure.

FIG. 7 is another timing diagram 700 of a resistive memory device in which a write pulse width is adjusted according to another aspect of the present disclosure. A clock signal 702 triggers a write command (WR) 704, in which a write pulse signal 708 is active (e.g., goes high) for a period of time. In this example, a target switching rate is set to eighty percent (80%). That is, a target is for 80% of the resistive memory elements to successfully switch. During a first period of a ring oscillator signal 706 in which a write pulse signal 708 is active, the 80% target switching rate for the resistive memory elements is met within a first time period 714 (TWA). During a second time period 716 (TWB), in which a read signal 710 is active high, the un-switched resistive memory elements are determined by a read out of the resistive memory elements. During the second time period 716, a switching signal 712 is also active. Finally, during a third time period 718, in which the write pulse signal 708 is active, the remaining percentage of un-switched resistive memory elements (e.g., 20%) are switched. Therefore, the process of the timing diagram 700 of FIG. 7 may ensure that all the resistive memory elements are eventually switched. In one configuration, the first time period 714 (TWA) is fixed and the second time period 716 (TWB) is variable.

Figure 8:
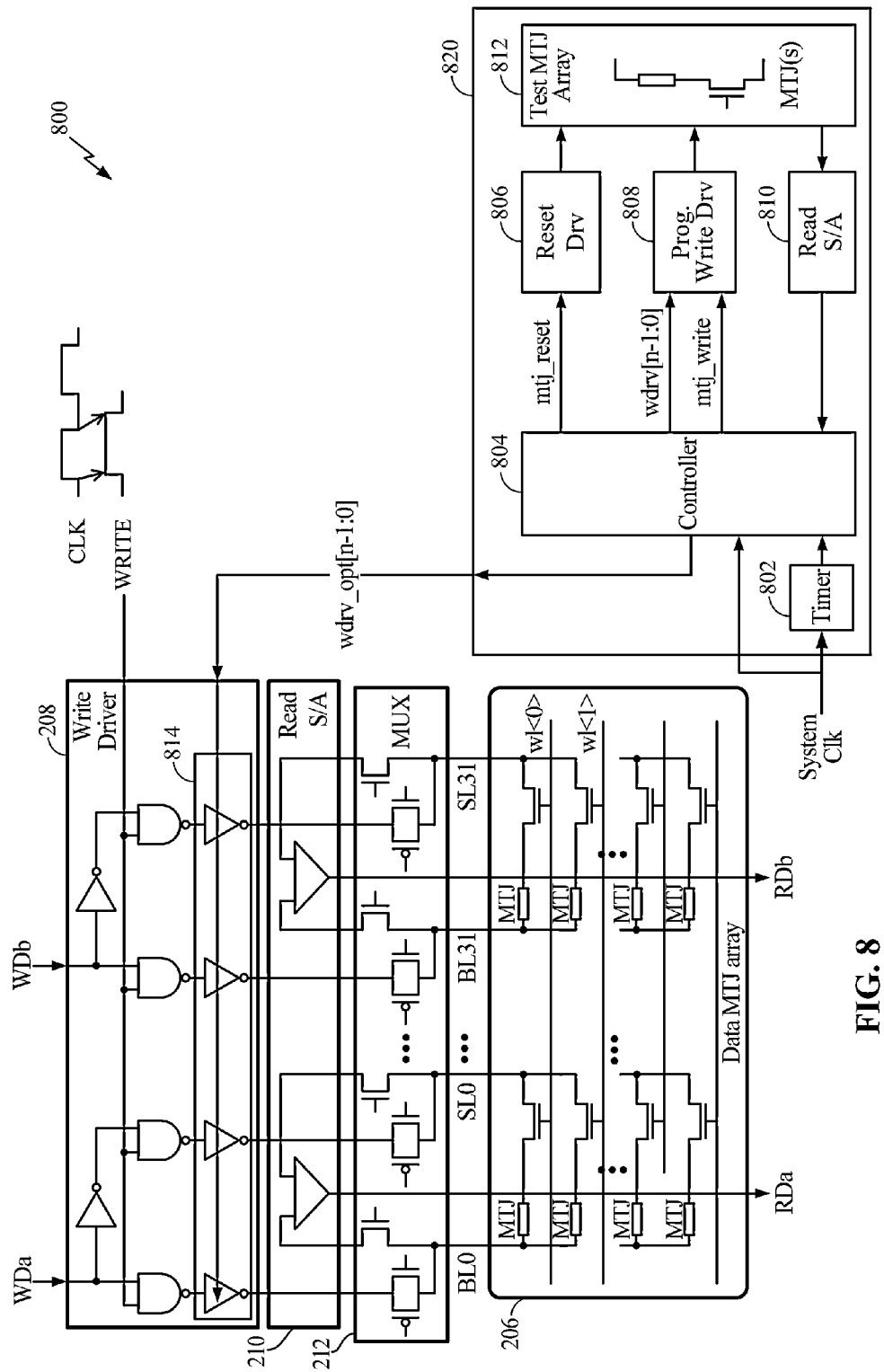
FIG. 8 is a schematic diagram of a resistive memory device designed to adjust write driver strength according to an aspect of the present disclosure.

FIG. 8 is a schematic diagram of a resistive memory device 800 in which a write pulse width is adjusted according to another aspect of the present disclosure. The resistive memory device 800 may be similar to the resistive memory device 200 of FIG. 2. In particular, the write driver 208, the read sense amplifier 210, the first multiplexer 212, and the second resistive memory element array 206 may be the same. A set of driving strength adjustable write drivers 814 are also shown. In this configuration, a write driver strength from the adjustable write driver strength signal (wdrv_opt[n−1:0]) provides a target switching rate. The resistive memory device 800 includes an adjustable write driver strength signal generator 820 that generates the adjustable write driver strength signal (wdrv_opt[n−1:0]).

The adjustable write driver strength signal generator 820 may operate a in a manner similar to the adjustable write pulse width signal generator 320 of FIGS. 3 and 4. The adjustable write driver strength signal generator 820 includes a controller 804 having an input for a system clock (system clk) signal and a timer 802. The controller 804 outputs an mtj_reset signal. In this configuration, the mtj_reset signal is input into a reset driver 806 to reset all the resistive memory elements in a test resistive memory element array 812 into a first state. The controller 804 also outputs an mtj_write signal and a write driver strength setting value (wdrv[n−1:0]) signal to a programmable write driver 808. The programmable write driver 808 may perform a write operation to switch all the resistive memory elements in the test resistive memory element array 812 into a second state that is not the first state.

After the resistive memory elements are switched, the switched elements are read by the internal read sense amplifier 810. Based on adjustments made in the controller 804, the process is repeated through the above-described components in the adjustable write driver strength signal generator 820 until the switching rate of the resistive memory elements in the test resistive memory element array 812 is equal to the target switching rate. Then, the adjustable write driver strength signal (wdrv_opt[n−1:0]) is output from the adjustable write driver strength signal generator 820. The operation of the adjustable write driver strength signal generator 820 is further described with reference to FIG. 9.

Figure 9:
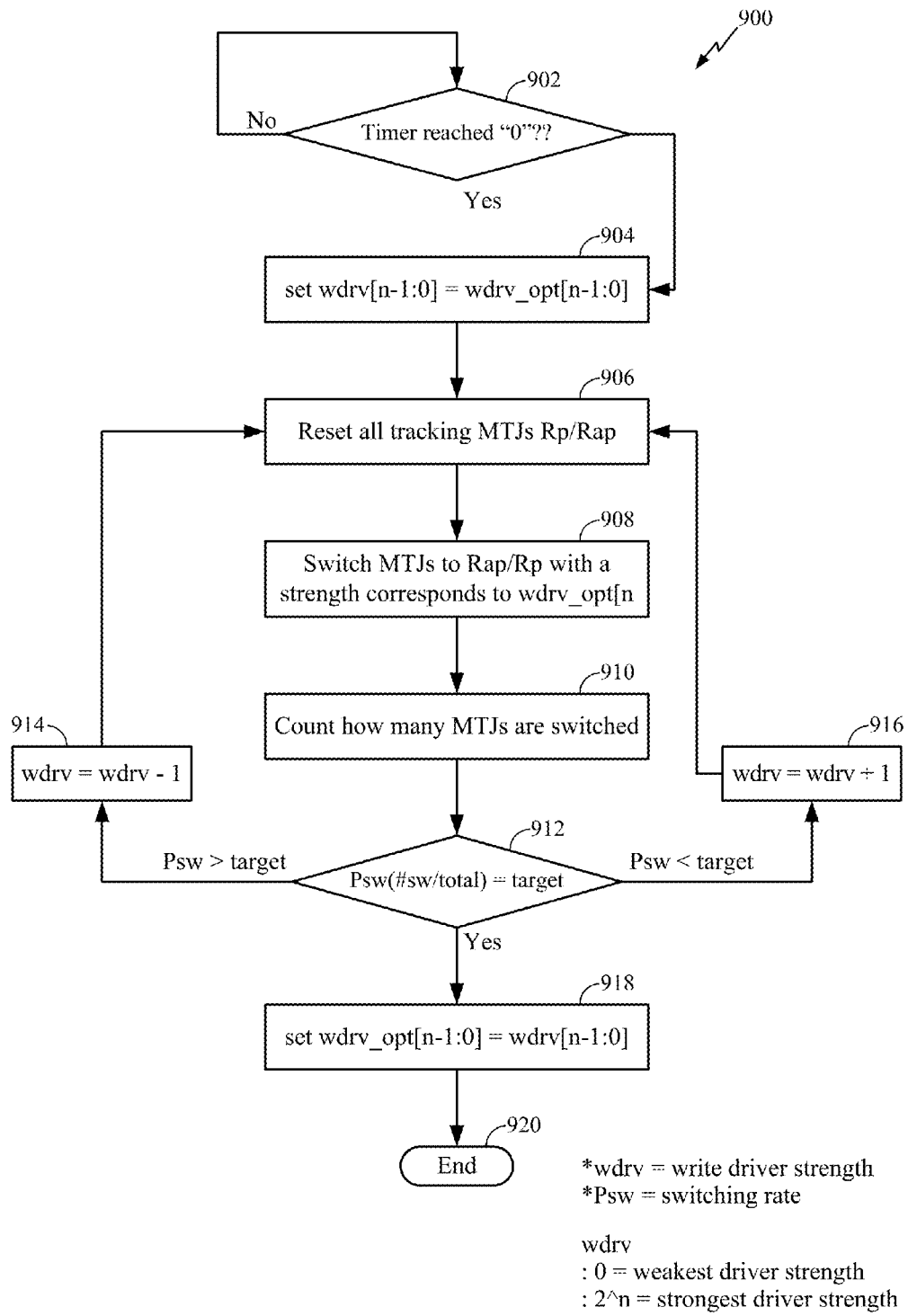
FIG. 9 is a process flow diagram illustrating a method of using a resistive memory device to adjust write driver strength according to an aspect of the present disclosure.

FIG. 9 is a process flow diagram 900 illustrating a method of using a resistive memory device to adjust write driver strength according to an aspect of the present disclosure. The process flow diagram 900 may be similar to the process performed by the adjustable write driver strength signal generator 820 of FIG. 8, the schematic diagram 400 of FIG. 4 and the process flow diagram 500 of FIG. 5. In decision block 902, the timer is compared to a "zero" (0) value and the initialization of the timer is determined. If the timer was not initialized, the timer is initialized and the process flow returns to decision block 902. If the timer was initialized, then the process continues to block 904, in which the write driver strength setting value (wdrv[n−1:0]) is set to the adjustable write driver strength value (wdrv_opt[n−1:0]), which may initially be zero, or have no value. In block 906, the resistive memory elements in a test resistive memory element array (e.g., test resistive memory element array 812) are reset to a first state. In block 908, the resistive memory elements in the test resistive memory element array are switched to a second state that is not the first state. The resistive memory elements are also switched with a write driver strength that corresponds to the adjustable write driver strength value (wdrv_opt[i], where i is the relevant index in the wdrv_opt array).

In block 910, a count of the resistive memory elements in the test resistive memory element array 812 that have switched is determined. In decision block 912, the switching rate (the percentage of resistive memory elements in the test resistive memory element array 812 that have successfully switched out of the total number of resistive memory elements in the test resistive memory element array 812) is compared to a target switching rate. The target switching rate may be set by a user to be a value approaching or equal to 100%. If the switching rate is greater than the target switching rate, then the write driver strength setting value is decremented in block 914. If the switching rate is less than the target switching rate, then the write driver strength setting value is incremented in block 916. If the switching rate is equal to the target switching rate, then the adjustable write driver strength value (wdrv_opt[n−1:0]) is set to be the write driver strength setting value (wdrv[n−1:0]). In block 920, the process flow diagram 900 terminates.

In one configuration, incremented or decremented means increasing or decreasing the relevant value by any amount. In one configuration, the adjustable write driver strength value and the write driver strength setting value is a single value, and not an array of values. In one configuration, zero (0) represents the weakest write driver strength and $2^n$ represents the strongest driver strength, where n represents the number of total resistive memory elements.

Figure 10:
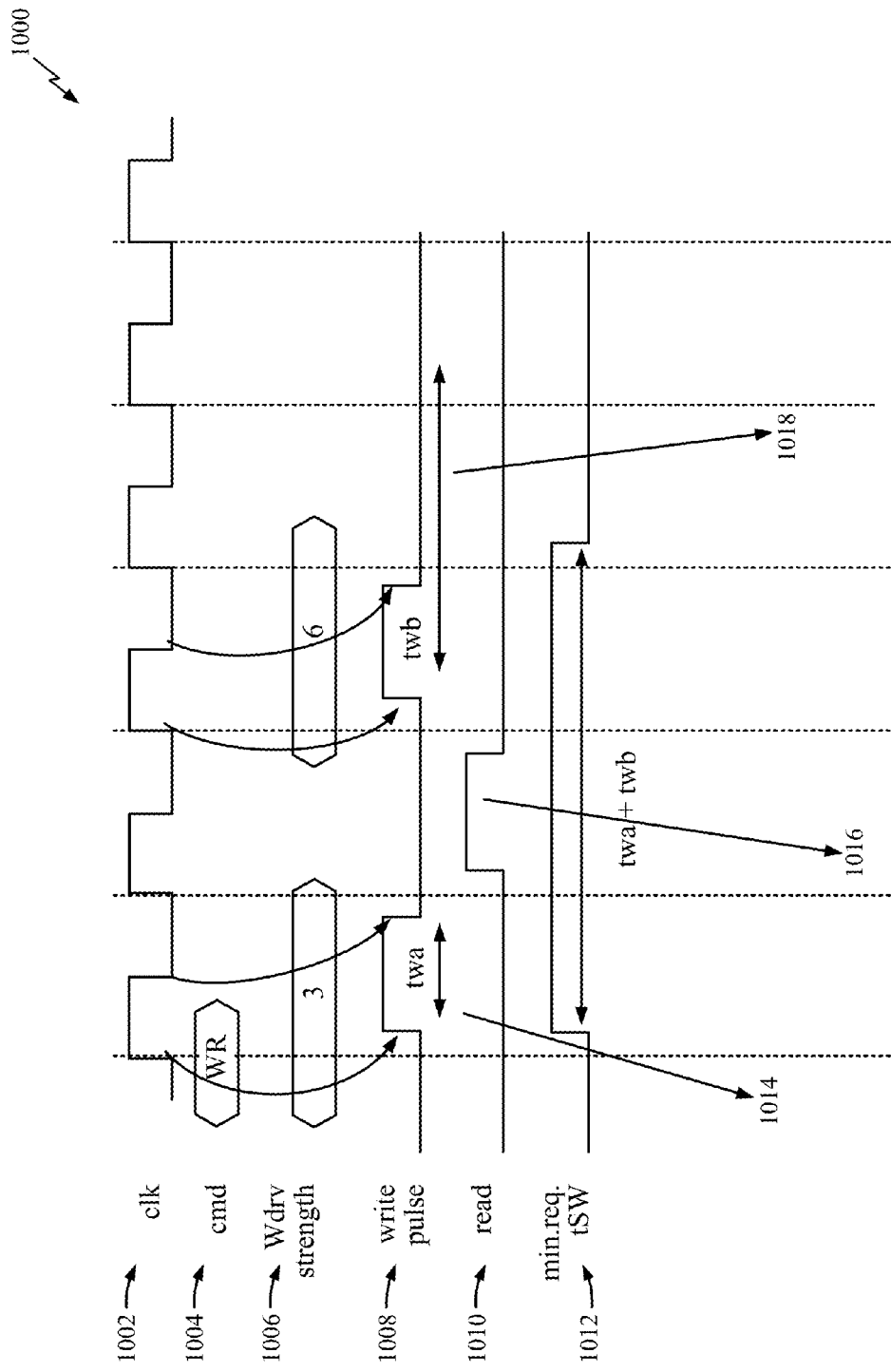
FIG. 10 is a timing diagram for a resistive memory device designed to adjust write driver strength according to an aspect of the present disclosure.

FIG. 10 is a timing diagram for a memory device in which a write driver strength is adjusted to provide a target switch rate according to a further aspect of the present disclosure. A clock signal 1002 triggers a write command (WR) 1004, in which a write pulse signal 1008 is active (e.g., goes high) for a period of time. In this example, a target switching rate may be set to switch 80% of the resistive memory elements in a test resistive memory element array.

During a first period of a write driver strength signal 1006 when a write pulse signal 1008 is active, the target switching rate of 80% for the resistive memory elements switched is met within a first time period 1014. During a second time period 1016, in which a read signal 1010 is active, the results of the "switched" resistive memory elements are read out. The number of un-switched resistive memory elements in a test resistive memory element array is determined from the read out. During the second time period 1016, a switching signal 1012 is also active. Finally, during a third time period 1018, in which the write pulse signal 1008 is active, the remaining percentage of un-switched resistive memory elements (in this case, 20%) are switched. Therefore, the process of the timing diagram 1000 of FIG. 10 may ensure that all the resistive memory elements are eventually switched.

Figure 11B:
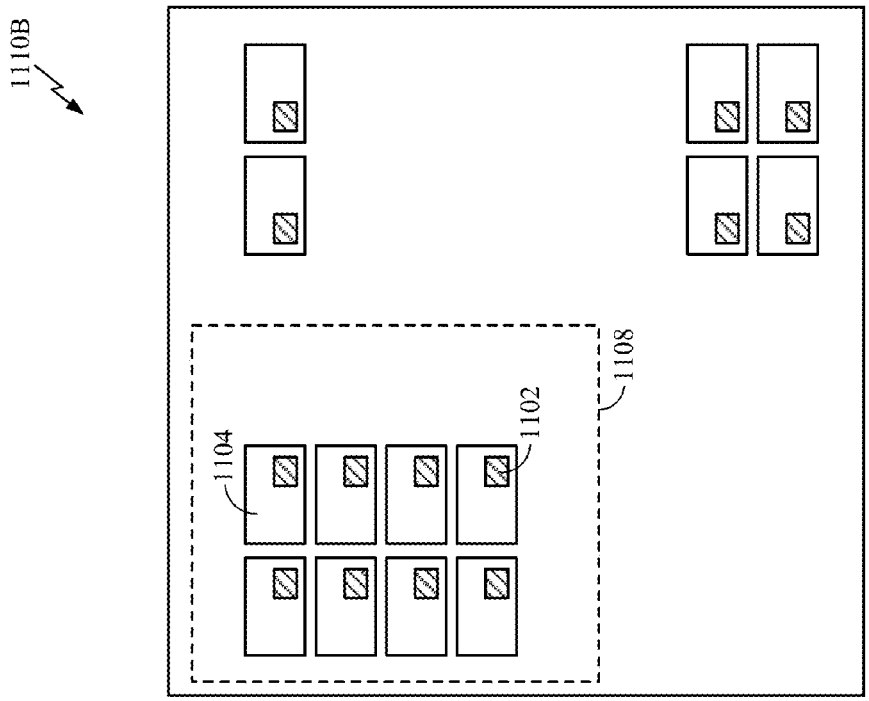
FIGS. 11A-11B illustrate different configurations of chip layouts for resistive memory devices according to aspects of the present disclosure.
Figure 11A:
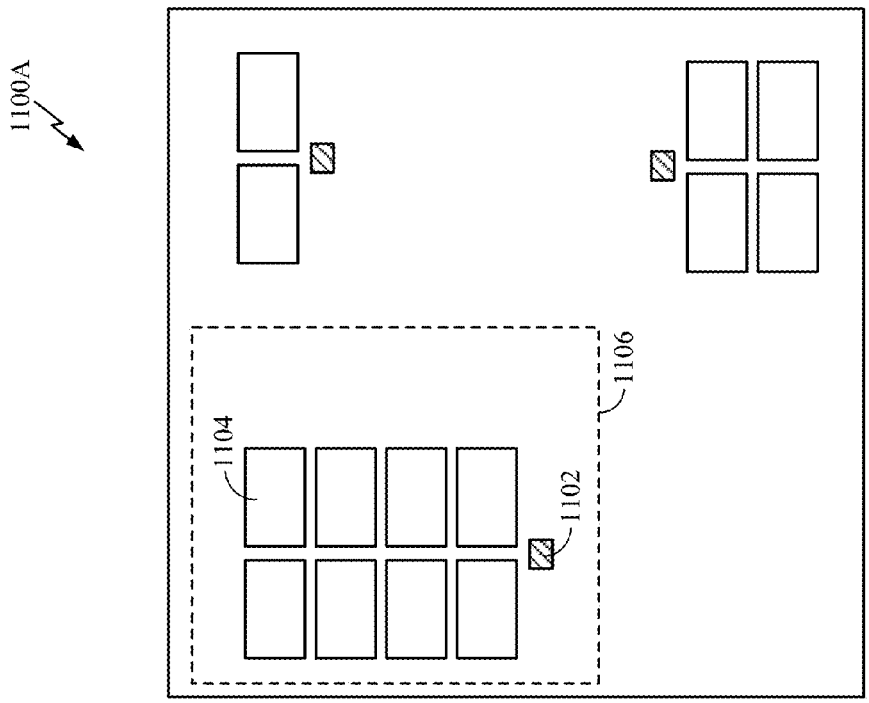

FIGS. 11A and 11B illustrate different configurations of chip layouts for resistive memory devices according to aspects of the present disclosure. In a first chip layout 1100A, a chip unit 1106 is formed by assigning a single monitor circuit 1102 (e.g., an element of the test resistive memory element array) to at least one of the resistive memory macros 1104. This first chip layout 1100A, including the chip unit 1106, may periodically monitor a resistive memory element write width (e.g., every several milliseconds (ms)). The monitoring in this case is less accurate, but the first chip layout 1100A may have reduced manufacturing cost. Also, the chip units 1106 of the first chip layout 1100A may occupy less chip real estate.

In second chip layout 1110B, a chip unit 1108 is formed by assigning a single monitor circuit 1102 to every resistive memory macro 1104. This second chip layout 1110B, including the chip unit 1108, monitors a resistive memory element write width for each received write/read command. The monitoring in this case is more accurate, but may increase manufacturing cost. Furthermore, the chip units 1108 of second chip layout 1110B may also consume more chip real estate when compared to the chip units 1106 of the first chip layout 1100A.

Figure 12:
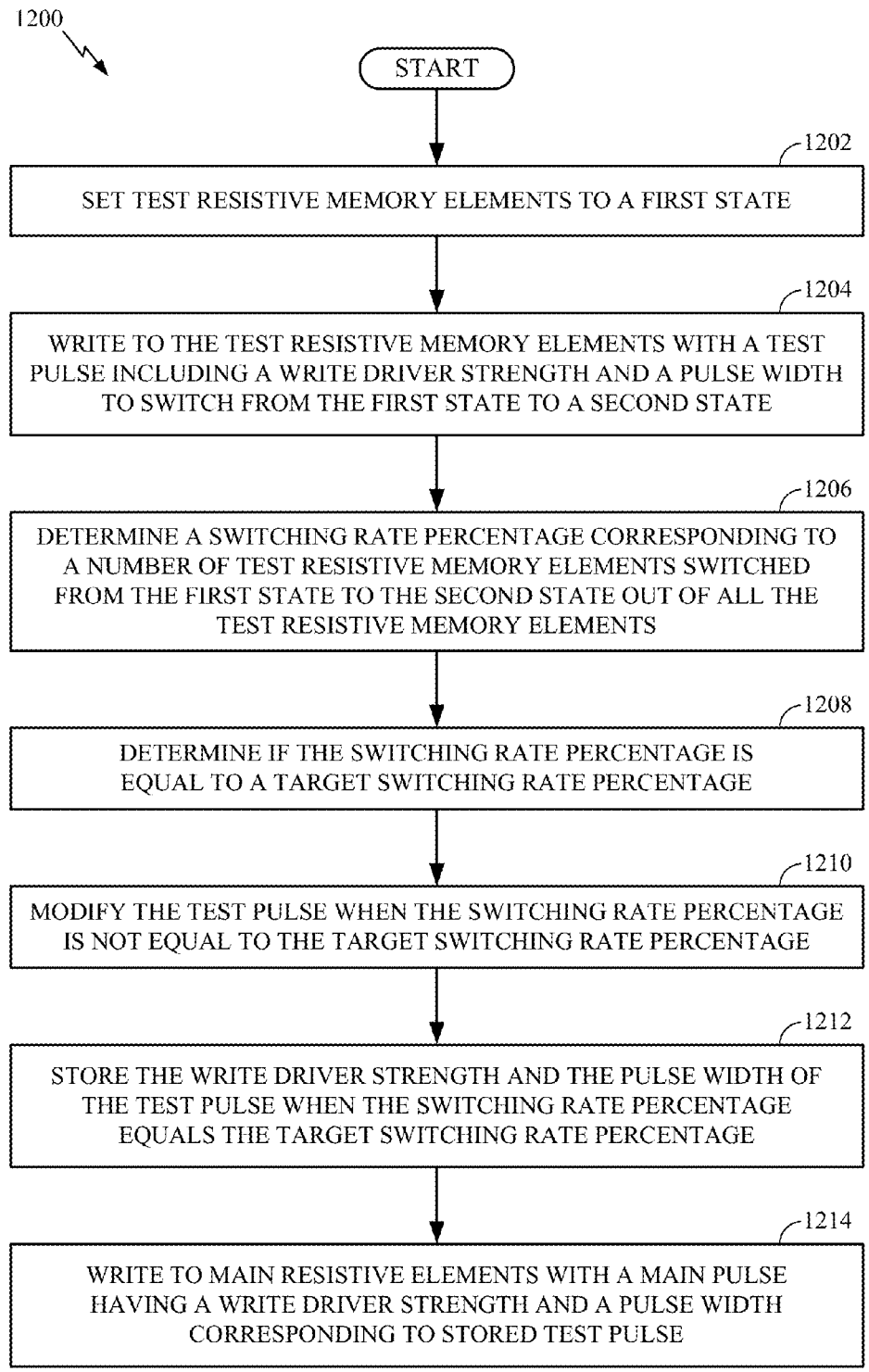
FIG. 12 is a process flow diagram illustrating a method of using a resistive memory device according to an aspect of the present disclosure.

FIG. 12 is a process flow diagram illustrating a method 1200 of using a resistive memory device according to an aspect of the present disclosure. In block 1202, the test resistive memory elements are set to a first state. In block 1204, the test resistive memory elements are written with a test pulse that includes a write driver strength and/or an adjusted pulse width to switch the test resistive memory elements from the first state to a second state. In block 1206, a switching rate percentage is determined. For example, the switching rate percentage may corresponding to a number of test resistive memory elements switched from the first state to the second state out of all the test resistive memory elements. In block 1208, it is determined whether the switching rate percentage is equal to a target switching rate percentage. In block 1210, the test pulse is modified when the switching rate percentage is not equal to the target switching rate percentage. In block 1212, the write driver strength and the pulse width of the test pulse are stored when the switching rate percentage equals the target switching rate percentage. In block 1214, main resistive elements are written to with a main pulse having a write driver strength and a pulse width corresponding to the stored test pulse.

Although blocks are shown in a particular sequence, the present disclosure is not so limited. Provided is a method to dynamically adjust the write pulse width and the write driver strength according to the switching time measured from a periodic switching pulse width monitoring circuit. The method provides for lower power consumption, an increase in energy savings, less breakdown of MTJ materials and improved efficiency in the writing/reading process for resistive memory devices.

In the above, a resistive memory device or a resistive memory element can include a magnetic tunnel junction (MTJ), a magnetic random access memory (MRAM), a resistive random access memory (RRAM), or any resistive memory with a reference system.

According to a further aspect of the present disclosure, a resistive memory array is provided. The resistive memory array includes means for controlling the resistive memory array. In one configuration, the means for controlling includes the controller 304, the controller 804 and/or the adjustable write driver strength signal generator 820. The resistive memory array also includes means for resetting test resistive memory elements coupled to the means for controlling. In one configuration, the means for resetting includes the write/reset driver 310 and/or the reset driver 806. The resistive memory array also includes means for writing to the test resistive memory elements. In one configuration, the means for writing is the write/reset driver 310, the programmable write driver 808 and/or the controller 804. The resistive memory array also includes means for reading from the test resistive memory elements. In one configuration, the means for reading includes the internal read sense amplifier 312 and/or the internal read sense amplifier 810.

The resistive memory array also includes the test resistive memory elements representing a resistive memory macro. The test resistive memory elements are coupled to the means for resetting, the means for writing and the means for reading. A change in state of at least one of the test resistive memory elements may represent a change in state of corresponding elements in the resistive memory macro. The test resistive memory elements may include the test resistive memory element array 314 and/or the test resistive memory element array 812, the first resistive memory element array 202 and/or the second resistive memory element array 206. In another aspect, the aforementioned means may be any circuit, module or any apparatus configured to perform the functions recited by the aforementioned means.

Figure 13:
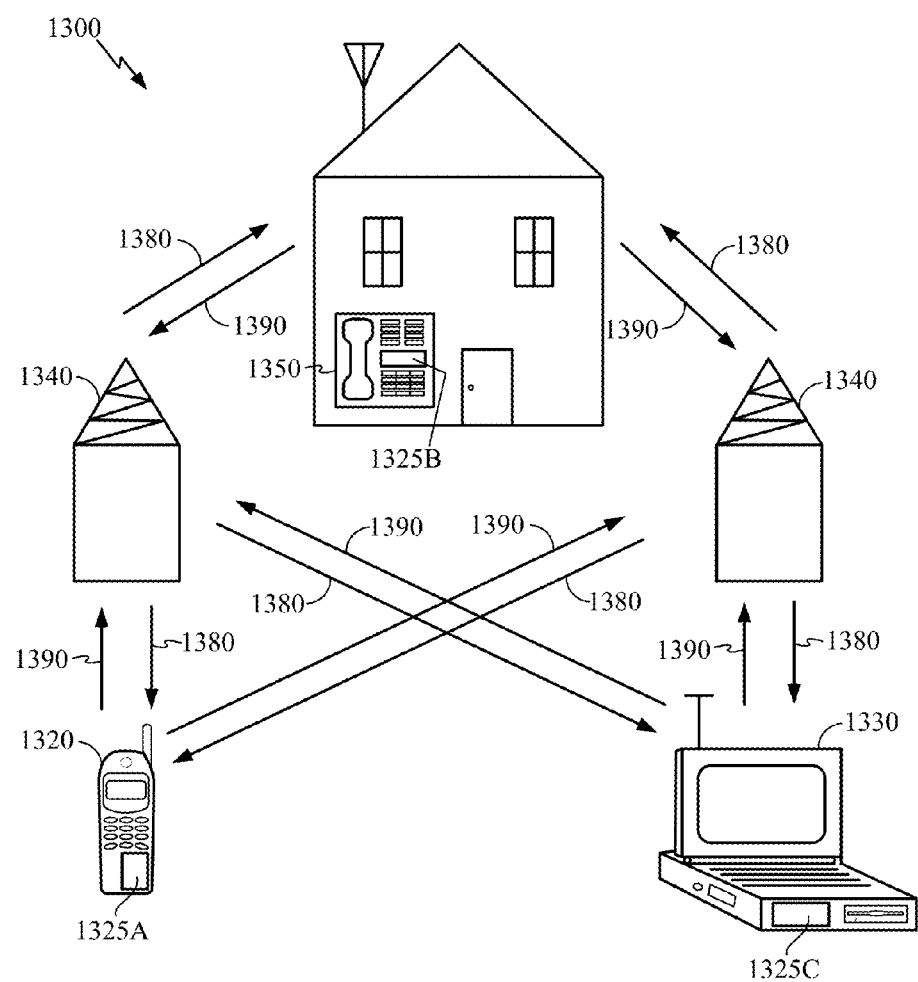
FIG. 13 is a block diagram showing an exemplary wireless communication system in which a configuration of the disclosure may be advantageously employed.

FIG. 13 is a block diagram showing an exemplary wireless communication system 1300 in which an aspect of the disclosure may be advantageously employed. For purposes of illustration, FIG. 13 shows three remote units 1320, 1330, and 1350 and two base stations 1340. It will be recognized that wireless communication systems may have many more remote units and base stations. Remote units 1320, 1330, and 1350 include IC devices 1325A, 1325C, and 1325B that include the disclosed resistive memory devices. It will be recognized that other devices may also include the disclosed resistive memory devices, such as the base stations, switching devices, and network equipment. FIG. 13 shows forward link signals 1380 from the base station 1340 to the remote units 1320, 1330, and 1350 and reverse link signals 1390 from the remote units 1320, 1330, and 1350 to base stations 1340.

In FIG. 13, remote unit 1320 is shown as a mobile telephone, remote unit 1330 is shown as a portable computer, and remote unit 1350 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or other devices that store or retrieve data or computer instructions, or combinations thereof. Although FIG. 13 illustrates remote units according to the aspects of the disclosure, the disclosure is not limited to these exemplary illustrated units. Aspects of the disclosure may be suitably employed in many devices, which include the disclosed resistive memory devices.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A resistive memory array, comprising:
a controller;
a test reset driver coupled to the controller;
a test write driver coupled to the controller;
a test read sense amplifier coupled to the controller; and
a plurality of test resistive memory elements representing a resistive memory macro, the plurality of test resistive memory elements coupled to the test reset driver, the test write driver and the test read sense amplifier, in which the plurality of test resistive memory elements are written with a test pulse that includes an adjusted write driver strength and/or an adjusted pulse width to switch the test resistive memory elements from a first state to a second state, in which a change in state of at least one of the plurality of test resistive memory elements represents a change in state of a plurality of corresponding elements in the resistive memory macro, and in which the controller is configured to store a decreased write driver strength relative to the adjusted write driver strength or a decreased pulse width relative to the adjusted pulse width of the test pulse when a switching rate percentage of the plurality of test resistive memory elements equals a target switching rate percentage.

2. The resistive memory array of claim 1, further comprising:
a ring oscillator coupled to the controller;
a counter coupled to the ring oscillator; and
a comparator coupled to the counter, the controller and the test write driver.

3. The resistive memory array of claim 1, in which each of the plurality of test resistive memory elements is associated with one resistive memory macro.

4. The resistive memory array of claim 1, in which each of the plurality of test resistive memory elements is associated with a plurality of resistive memory macros.

5. The resistive memory array of claim 1 integrated into a mobile phone, a set top box, a music player, a video player, an entertainment unit, a navigation device, a computer, a hand-held personal communication systems (PCS) unit, a portable data unit, and/or a fixed location data unit.

6. A resistive memory array, comprising:
means for controlling the resistive memory array;
means for resetting a plurality of test resistive memory elements coupled to the means for controlling;
means for writing to the plurality of test resistive memory elements coupled to the means for controlling;
means for reading from the plurality of test resistive memory elements coupled to the means for controlling, the plurality of test resistive memory elements representing a resistive memory macro, the plurality of test resistive memory elements coupled to the means for resetting, the means for writing and means for reading, in which the plurality of test resistive memory elements are written with a test pulse that includes a write driver strength and/or an adjusted pulse width to switch the test resistive memory elements from a first state to a second state, and in which a change in state of at least one of the plurality of test resistive memory elements represents a change in state of a plurality of corresponding elements in the resistive memory macro; and means for storing a decreased write driver strength or a decreased pulse width of the test pulse when a switching rate percentage of the plurality of test resistive memory elements equals a target switching rate percentage.

7. The resistive memory array of claim 6, further comprising:
a ring oscillator coupled to the means for controlling;
a counter coupled to the ring oscillator; and
a comparator coupled to the counter, the means for controlling and the means for writing.

8. The resistive memory array of claim 6, in which each of the plurality of test resistive memory elements is associated with one resistive memory macro.

9. The resistive memory array of claim 6, in which each of the plurality of test resistive memory elements is associated with a plurality of resistive memory macros.

10. The resistive memory array of claim 6 integrated into a mobile phone, a set top box, a music player, a video player, an entertainment unit, a navigation device, a computer, a hand-held personal communication systems (PCS) unit, a portable data unit, and/or a fixed location data unit.

11. A method, comprising:
setting a plurality of test resistive memory elements to a first state;
writing to the plurality of test resistive memory elements with a test pulse comprising a write driver strength and a pulse width to switch the plurality of test resistive memory elements from the first state to a second state;
determining a switching rate percentage corresponding to a number of test resistive memory elements switched from the first state to the second state out of the plurality of test resistive memory elements;
determining if the switching rate percentage is equal to the target switching rate percentage;
modifying the test pulse when the switching rate percentage is not equal to the target switching rate percentage;
storing the write driver strength and the pulse width of the test pulse when the switching rate percentage equals the target switching rate percentage; and
writing to a plurality of main resistive memory elements with a main pulse having an actual write driver strength and an actual pulse width corresponding to the write driver strength and the pulse width of the test pulse in which modifying the test pulse comprises decreasing the write driver strength when the switching rate percentage is greater than the target switching rate percentage.

12. The method of claim 11, in which modifying the test pulse comprises increasing the pulse width when the switching rate percentage is less than the target switching rate percentage.

13. The method of claim 11, in which modifying the test pulse comprises decreasing the pulse width when the switching rate percentage is greater than the target switching rate percentage.

14. The method of claim 11, in which modifying the test pulse comprises increasing the write driver strength when the switching rate percentage is less than the target switching rate percentage.

15. The method of claim 11, further comprising integrating the plurality of main resistive memory elements into a mobile phone, a set top box, a music player, a video player, an entertainment unit, a navigation device, a computer, a hand-held personal communication systems (PCS) unit, a portable data unit, and/or a fixed location data unit.

16. A method, comprising:
the step of setting a plurality of test resistive memory elements to a first state;
the step of writing to the plurality of test resistive memory elements with a test pulse comprising a write driver strength and a pulse width to switch the plurality of test resistive memory elements from the first state to a second state;
the step of determining a switching rate percentage corresponding to a number of test resistive memory elements switched from the first state to the second state out of the plurality of test resistive memory elements;
the step of determining if the switching rate percentage is equal to the target switching rate percentage;
the step of modifying the test pulse when the switching rate percentage is not equal to the target switching rate percentage;
the step of storing the write driver strength and the pulse width of the test pulse when the switching rate percentage equals the target switching rate percentage; and
the step of writing to a plurality of main resistive memory elements with a main pulse having a write driver strength and a pulse width corresponding to the write driver strength and the pulse width of the test pulse in which the step of modifying the test pulse comprises the step of decreasing the pulse width when the switching rate percentage is greater than the target switching rate percentage.

17. The method of claim 16, in which the step of modifying the test pulse comprises the step of increasing the pulse width when the switching rate percentage is less than the target switching rate percentage.

18. The method of claim 16, further comprising the step of integrating the plurality of main resistive memory elements into a mobile phone, a set top box, a music player, a video player, an entertainment unit, a navigation device, a computer, a hand-held personal communication systems (PCS) unit, a portable data unit, and/or a fixed location data unit.

* * * * *